United States Patent [19]
Murari et al.

[11] Patent Number: 4,714,897
[45] Date of Patent: Dec. 22, 1987

[54] MONOLITHICALLY INTEGRATABLE SIGNAL AMPLIFIER STAGE WITH HIGH OUTPUT DYNAMICS

[75] Inventors: Bruno Murari, Monza; Mauro Pasetti; Nazzareno Rossetti, both of Milan, all of Italy

[73] Assignee: SGS Microelettronica SpA, Agrate Brianza, Italy

[21] Appl. No.: 809,877

[22] Filed: Dec. 17, 1985

[30] Foreign Application Priority Data

Dec. 28, 1984 [IT] Italy .................................. 24276 A/84

[51] Int. Cl.$^4$ ............................................. H03F 3/04
[52] U.S. Cl. .................................................... 330/288
[58] Field of Search ................ 330/288, 257; 323/315, 323/316

[56] References Cited

U.S. PATENT DOCUMENTS 4,323,797  4/1982  Embree et al. .................. 323/316 X
4,575,686  3/1986  Palara et al. ..................... 330/267 X Primary Examiner—James B. Mullins
Attorney, Agent, or Firm—Wenderoth, Lind & Ponack

[57] ABSTRACT

A monolithically integratable signal amplifier stage with high output dynamics includes first, second, and third bipolar NPN transistors and first and second current mirror circuits. The collector terminal of the first transistor is connected to the positive terminal of a supply voltage generator. The base terminal of the first transistor is in input terminal of the amplifier stage. The base terminals of the second and third transistors are connected to the emitter terminal of the first transistor, which is connected via first constant current generator to the negative terminal of the supply voltage generator. The second and third transistors also have their emitters connected to the negative terminal of the supply voltage generator. The input of the first current mirror circuit and the output of the second current mirror circuit are connected to the collector terminals of the third and second transistors. The output of the first current mirror circuit and the input of the second current mirror circuit are both connected via a second constant current generator to the negative terminal of the supply voltage generator.

8 Claims, 1 Drawing Figure

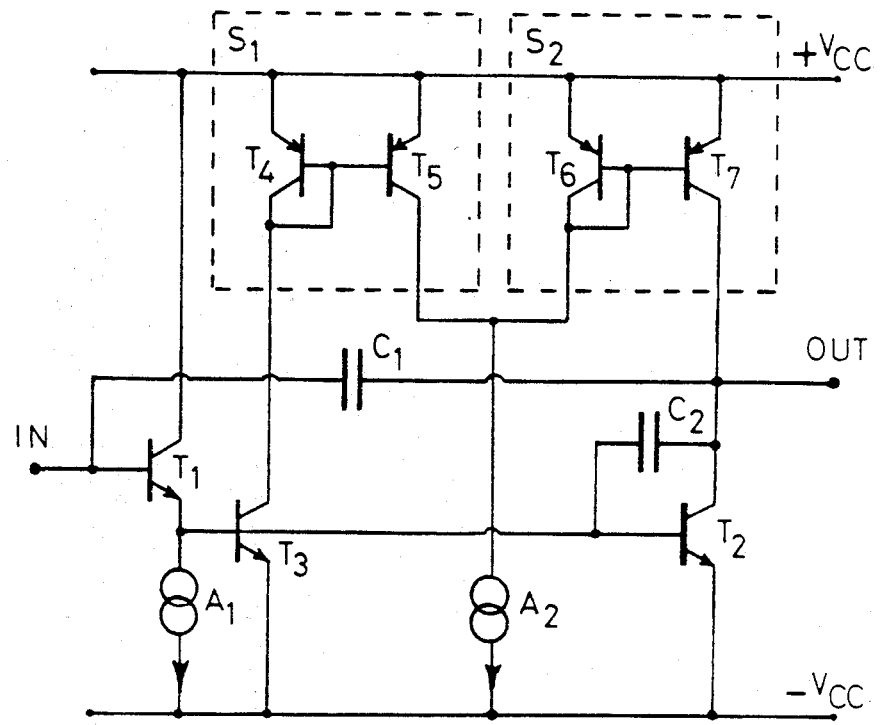

MONOLITHICALLY INTEGRATABLE SIGNAL AMPLIFIER STAGE WITH HIGH OUTPUT DYNAMICS

BACKGROUND OF THE INVENTION

The present invention relates to a monolithically integratable signal amplifier circuit, especially to an amplifier stage with high output dynamics.

An amplifier stage with high output dynamics generally comprises a pair of series connected final transistors operating in class AB connected between the two terminals of a supply voltage generator by their emitter and collector terminals and arranged so as to conduct in phase opposition via their base terminals. The output terminal of the amplifier stage is constituted by the connection point between the two transistors.

In this instance, the maximum possible amplitude of the output signal, which is equal to the supply voltage minus the voltage loss of the circuit or the minimum voltage necessary for the circuit to maintain its typical operating characteristics, is equal to the supply voltage minus twice the collector-emitter voltage $V_{CE\ sat}$ of a bipolar transistor operating in saturation. In fact, in an amplifier stage having transistors operating in class AB, the minimum voltage loss is obtained through each signal half wave causing the final transistor which is conducting to operate in saturation when the input signal reaches the level corresponding to the maximum output amplitude.

More or less complex circuits are used by those skilled in the art for amplifier stages of this type as a function of the characteristics to be obtained. For example, an output stage with high dynamics presenting a minimum operating voltage less than that of the other known circuits is described in U.S. Pat. No. 4,575,686 to Palara et al.

SUMMARY OF THE INVENTION

The object of the present invention is to provide a monolithically integratable signal amplifier stage with high output dynamics which is characterized by an especially simple circuit while retaining very good general performance.

The object of the present invention may be achieved by providing a monolithically integratable signal amplifier stage comprising a first and a second semiconductor circuit element, each having a first and a second terminal and a control terminal, said control terminal of said first circuit element being an input terminal of said amplifier stage; wherein said second terminal of said first circuit element is connected to a first terminal of a supply voltage generator, and said first terminal of said first circuit element is coupled either to said control terminal of said second circuit element or via a first constant current generator to a second terminal of said supply voltage generator to which is also connected said first terminal of said second circuit element; said signal amplifier also comprising a third semiconductor circuit element having a first and a second terminal and a control terminal and at least a first and a second current mirror circuit coupled to said first terminal of said supply voltage generator and each having an input and an output, said first terminal and control terminal of said third circuit element being respectively connected to said second terminal of said supply voltage generator and to said first terminal of said first circuit element, said input of said first current mirror circuit being connected to said second terminal of said third circuit element, and said output of said first current mirror circuit and said input of said second current mirror circuit are both connected to said second terminal of said supply voltage generator via a second constant current generator and said output of said second current mirror circuit and said second terminal of said second circuit element are connected together so as to constitute an output terminal of said amplifier stage.

BRIEF DESCRIPTION OF THE DRAWINGS

The drawing FIGURE illustrates a circuit in accordance with the present invention.

DESCRIPTION OF THE PREFERRED EMBODIMENT

The invention will be better understood from the following detailed non-limiting description given solely by way of example and relative to the drawing which shows the circuit of a signal amplifier stage in accordance with the invention.

The circuit of a signal amplifier stage in accordance with the invention shown in the drawing comprises first, $T_1$, second, $T_2$, and third $T_3$ bipolar NPN transistors.

The base terminal of transistor $T_1$ constitutes the input terminal IN of the amplifier stage.

The collector and the emitter terminals of transistor $T_1$ are connected to the positive terminal $+V_{cc}$ of a supply voltage generator and by means of a first constant current generator $A_1$ to the negative terminal $-V_{cc}$ of the supply voltage generator.

The base terminals of transistors $T_2$ and $T_3$ are both connected to the emitter terminal of the transistor $T_1$ and their emitter terminals are connected to the negative terminal $-V_{cc}$.

The circuit shown in FIGURE also comprises fourth, $T_4$, fifth, $T_5$, sixth, $T_6$, and seventh $T_7$ bipolar NPN transistors.

The emitter terminals of these transistors $T_4$, $T_5$, $T_6$, and $T_7$ are connected to the positive terminal $+V_{cc}$.

The base terminal of transistor $T_4$ is connected to the base terminal of transistor $T_5$. The base terminal of transistor $T_6$ is connected to the base terminal of transistor $T_7$. The base and collector terminals of transistor $T_4$ are connected together. The base and collector terminals of transistor $T_6$ are also connected together.

The collector terminal of transistor $T_4$ is connected to the collector terminal of transistor $T_3$. The collector terminals of transistors $T_5$ and $T_6$ are both connected to negative terminal $-V_{cc}$ via a second constant current generator $A_2$.

The collector terminals of transistors $T_2$ and $T_7$ are connected together and constitute the output terminal OUT of the amplifier stage.

Transistors $T_4$ and transistor $T_5$ together constitute a first current mirror circuit $S_1$. Their respective collector terminals constitute the input and the output of the first current mirror circuit.

Transistor $T_6$ and transistor $T_7$ together constitute a second current mirror circuit $S_2$. Their respective collector terminals constitute the input and the output of the second current mirror circuit.

Current mirror circuits $S_1$ and $S_2$ constituted in this manner are delimited in the drawing by dotted lines.

The circuit also comprises a first compensation capacitor $C_1$ connected between the base terminal of transistor $T_1$ and output terminal OUT.

The operation of an amplifier stage in accordance with the invention will now be described with reference to the circuit shown in the drawing FIGURE, assuming that each component is in a normal operating condition when no signal is present. Assume that a signal is input to input terminal IN which causes an increase in the conduction of transistor $T_1$, i.e.—a positive signal.

Since generator $A_1$ imposes a constant current toward terminal $-V_{cc}$, the increase of the emitter current of transistor $T_1$ causes, via their base terminals, an increased conduction in either transistor $T_2$ or transistor $T_3$. The collector current increase of transistor $T_3$ causes an increase in the current level in the input and, as a consequence, in the output of the first current mirror circuit $S_1$.

Since constant current generator $A_2$ imposes a predetermined value for the total sum of the current flowing in the respective outputs and inputs of the first current mirror circuit $S_1$ and the second current mirror circuit $S_2$, the increase of the current flowing in the output of the current mirror circuit $S_2$ causes a reduction in the current flowing in the input of the current mirror circuit $S_2$.

There is then a corresponding reduction in the current which flows in the output of the current mirror circuit $S_2$.

An increase in the collector current of transistor $T_2$ corresponds on the other hand to an increase in the base current supplied to transistor $T_2$ from transistor $T_1$, and the collector-emitter voltage therefore decreases as does the available voltage at output terminal OUT with respect to the potential of negative terminal $-V_{cc}$.

For elevated input signals corresponding to the half waves which cause an increase in the conduction of transistor $T_1$, transistor $T_2$ operates directly in saturation, permitting a minimum voltage loss.

When, on the other hand, for an input signal which causes a reduction in the conduction of transistor $T_1$, the operation of each transistor is opposite to that described above. That is, transistor $T_2$ receives from transistor $T_7$ a current greater than what the correct base current supplied from transistor $T_1$ would permit. The collector-emitter voltage of transistor $T_7$ lowers, causing an increase in the voltage available at the output terminal OUT with respect to the potential of negative terminal $-V_{cc}$.

For elevated input signals corresponding to the half waves which cause a reduction in the conduction of transistor $T_1$, transistor $T_7$ operates in saturation, also permitting a minimum voltage loss in this instance.

The resultant signal amplification is essentially determined by the current gain of each of the two current mirror circuits $S_1$ and $S_2$.

The maximum signal amplitude is, as is indicated for amplifier stages of this type, equal to the supply voltage minus twice the collector-emitter voltage $V_{CE\ sat}$ of a bipolar transistor which operates in saturation, and is therefore the best obtainable result when operating with transistors.

The quiescent operating point of the amplifier stage is determined by the constant current imposed by current generator $A_2$ and by the current gains of current mirror circuits $S_1$ and $S_2$. The maximum available current at the output terminal OUT is equal to the constant current imposed by current generator $A_2$ multiplied by the current gain of the second current mirror circuit $S_2$.

An amplifier stage in accordance with the present invention can therefore offer elevated output dynamics together with an excellent relationship between quiescent current and peak current in the output. This can also be used when only low supply voltage are available.

The simplicity of the circuitry of an amplifier stage in accordance with the present invention is especially evident, and is industrially economical both on account of the ease of manufacture and the reduced number of components.

An amplifier stage in accordance with the present invention is particularly suitable for constructing the final stage of a monolithically integrated differential amplifier with high output dynamics.

Even though only a single embodiment of the invention was illustrated and described, it is obvious that numerous variants are possible without departing from the scope of the invention.

For example, current mirror circuits $S_1$ and $S_2$ can be constructed in a more complex manner than if indicated in the drawing in order to obtain better characteristics. Moreover, their number can be greater than two, provided that they are always coupled together two-by-two with a constant current generator, as is indicated in the drawing for $S_1$ and $S_2$.

We claim:

1. A monolithically integratable signal amplifier stage comprising a first and a second semiconductor circuit element, each having a first and a second terminal and a control terminal, said control terminal of said first circuit element being an input terminal of said amplifier stage; wherein said second terminal of said first circuit element is connected to a first terminal of a supply voltage generator, and said first terminal of said first circuit element is coupled to both said control terminal of said second circuit element and, via a first constant current generator, to a second terminal of said supply voltage generator to which is also connected said first terminal of said second circuit element; said signal amplifier also comprising a third semiconductor circuit element having a first and a second terminal and a control terminal and at least a first and a second current mirror circuit coupled to said first terminal of said supply voltage generator and each having an input and an output, said first terminal and control terminal of said third circuit element being respectively connected to said second terminal of said supply voltage generator and to said first terminal of said first circuit element, said input of said first current mirror circuit being connected to said second terminal of said third circuit element, and said output of said first current mirror circuit and said input of said second current mirror circuit are both connected to said second terminal of said supply voltage generator via a second constant current generator and said output of said second current mirror circuit and said second terminal of said second circuit element are connected together so as to constitute an output terminal of said amplifier stage.

2. A signal amplifier stage according to claim 1, wherein said first and second and third semiconductor circuit elements each comprise at least one transistor having a first terminal, a second terminal and a control terminal coupled respectively to said first terminal, second terminal and control terminal of its respective circuit element.

3. A signal amplifier stage according to claim 2, wherein at least one of said current mirror circuits comprises a first and a second PNP transistor having base terminals which are connected to each other and having emitter terminals connected to said first terminal of said supply voltage generator, wherein collector terminals of these first and second PNP transistors are respectively said input and output of their respective current mirror circuit.

4. A signal amplifier stage according to claim 1, wherein at least one of said semiconductor circuit elements is a bipolar transistor whose emitter, collector and base terminals are respectively said first terminal, second terminal and control terminal of its respective element.

5. A signal amplifier stage according to claim 4, wherein at least one of said current mirror circuits comprises a first and a second PNP transistor having base terminals which are connected to each other and having emitter terminals connected to said first terminal of said supply voltage generator, wherein collector terminals of these first and second PNP transistors are respectively said input and output of their respective current mirror circuit.

6. A signal amplifier stage according to claim 1, wherein each of said semiconductor circuit elements is bipolar NPN transistor whose emitter, collector and base terminals are respectively said first terminal, second terminal and control terminal of its respective element.

7. A signal amplifier stage according to claim 6, wherein at least one of said current mirror circuits comprises a first and a second PNP transistor having base terminals which are connected to each other and having emitter terminals connected to said first terminal of said supply voltage generator, wherein collector terminals of these first and second PNP transistors are respectively said input and output of their respective current mirror circuit.

8. A signal amplifier stage according to claim 1, wherein at least one of said current mirror circuits comprises a first and a second PNP transistor having base terminals which are connected to each other and having emitter terminals connected to said first terminal of said supply voltage generator, wherein collector terminals of these first and second PNP transistors are respectively said input and output of their respective current mirror circuit.

* * * * *